(12) United States Patent
Wan (10) Patent No.: US 12,525,931 B2
(45) Date of Patent: Jan. 13, 2026

(54) AMPLIFICATION DEVICE INCLUDING AN AMPLIFICATION UNIT AND A COUPLER USED TO REDUCE INSERTION LOSS AND CIRCUIT AREA

(71) Applicant: RichWave Technology Corp., Taipei (TW)

(72) Inventor: Kuang-Lieh Wan, Taipei (TW)

(73) Assignee: RichWave Technology Corp., Taipei (TW)

(*) Notice: Subject to any disclaimer, the term of this patent is extended or adjusted under 35 U.S.C. 154(b) by 507 days.

(21) Appl. No.: 18/089,534

(22) Filed: Dec. 27, 2022

(65) Prior Publication Data

US 2024/0213933 A1 Jun. 27, 2024

(30) Foreign Application Priority Data

Aug. 2, 2022 (TW) .................................. 111128963

(51) Int. Cl.
| | |
|---|---|
| *H03F 3/191* | (2006.01) |
| *H03F 1/02* | (2006.01) |
| *H03F 1/56* | (2006.01) |
| *H03F 3/195* | (2006.01) |

(52) U.S. Cl.
CPC .......... *H03F 3/195* (2013.01); *H03F 1/0283* (2013.01); *H03F 1/565* (2013.01)

(58) Field of Classification Search
CPC ....................................... H03F 3/191
USPC .................................. 330/302, 305
See application file for complete search history.

(56) References Cited

U.S. PATENT DOCUMENTS

| | | | |
|---|---|---|---|
| 7,907,032 B2 | 3/2011 | Yamamoto | |
| 8,289,102 B2 | 10/2012 | Yamamoto | |

FOREIGN PATENT DOCUMENTS

| | | |
|---|---|---|
| CN | 101908881 A | 12/2010 |
| CN | 111641391 A | 9/2020 |
| CN | 114337567 A | 4/2022 |
| TW | 201735533 A | 10/2017 |
| WO | 2013/102965 A1 | 7/2013 |
| WO | 2015/101147 A1 | 7/2015 |

OTHER PUBLICATIONS

Office action mailed on Feb. 17, 2023 for the Taiwan application No. 111128963, filing date Aug. 2, 2022, pp. 1-5.

*Primary Examiner* — Henry Choe
(74) *Attorney, Agent, or Firm* — Winston Hsu (57) ABSTRACT

An amplification device includes a signal input terminal, a signal output terminal, an amplification unit, a coupler, an inductive element and a capacitive element. The amplification unit includes an input terminal and an output terminal, where the input terminal is coupled to the signal input terminal. The coupler includes an input terminal, an output terminal and a coupling terminal, where the input terminal is coupled to the output terminal of the amplification unit, and the output terminal is coupled to the signal output terminal. The inductive element is coupled to the coupler in parallel and includes a first terminal and a second terminal, where the first terminal is coupled to the output terminal of the amplification unit, and the second terminal is coupled to the output terminal of the coupler. The capacitive element is coupled between the output terminal of the coupler and a reference voltage terminal.

11 Claims, 11 Drawing Sheets

AMPLIFICATION DEVICE INCLUDING AN AMPLIFICATION UNIT AND A COUPLER USED TO REDUCE INSERTION LOSS AND CIRCUIT AREA

TECHNICAL FIELD

The disclosure is related to an amplification device, and more particularly, an amplification device including an amplification unit and a coupler used to reduce the insertion loss and the circuit area.

BACKGROUND

In a radio frequency circuit, an amplifier can be coupled to a matching circuit and a coupler, so a signal can be amplified and processed and then outputted to the radio frequency circuit or an antenna to be received or transmitted.

In this conventional structure, the coupler often causes coupling loss, so the power of the signal may be decreased, hence reducing the quality of the signal.

In addition, the matching circuit and the coupler occupy additional space in the radio frequency circuit, hence a solution is in need to reduce the insertion loss and the circuit area.

SUMMARY

An embodiment provides an amplification device including a signal input terminal, a signal output terminal, an amplification unit, a coupler, an inductive element and a capacitive element. The amplification unit includes an input terminal coupled to the signal input terminal, and an output terminal. The coupler includes an input terminal coupled to the output terminal of the amplification unit, an output terminal coupled to the signal output terminal, and a coupling terminal. The inductive element is coupled to the coupler in parallel, and includes a first terminal coupled to the output terminal of the amplification unit, and a second terminal coupled to the output terminal of the coupler. The capacitive element includes a first terminal coupled to the output terminal of the coupler, and a second terminal coupled to a reference voltage terminal.

Another embodiment provides an amplification device including a signal input terminal, a signal output terminal, an amplification unit, a first coupler, a first capacitive element, a second coupler and a second capacitive element. The amplification unit includes an input terminal coupled to the signal input terminal, and an output terminal. The first coupler includes an input terminal coupled to the output terminal of the amplification unit, an output terminal coupled to the signal output terminal, and a coupling terminal. The first capacitive element includes a first terminal coupled to the output terminal of the first coupler, and a second terminal coupled to a reference voltage terminal. The second coupler includes an input terminal coupled to the output terminal of the amplification unit, an output terminal coupled to the signal output terminal, and a coupling terminal. The second capacitive element includes a first terminal coupled to the output terminal of the second coupler, and a second terminal coupled to the reference voltage terminal.

BRIEF DESCRIPTION OF THE DRAWINGS

FIG. 1 to FIG. 3B illustrate amplification devices according to different embodiments.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

In the text, if a plurality of items are connected with "and/or", it can mean at least one of the items, any combinations of the items, or all of the items.

Figure 1:
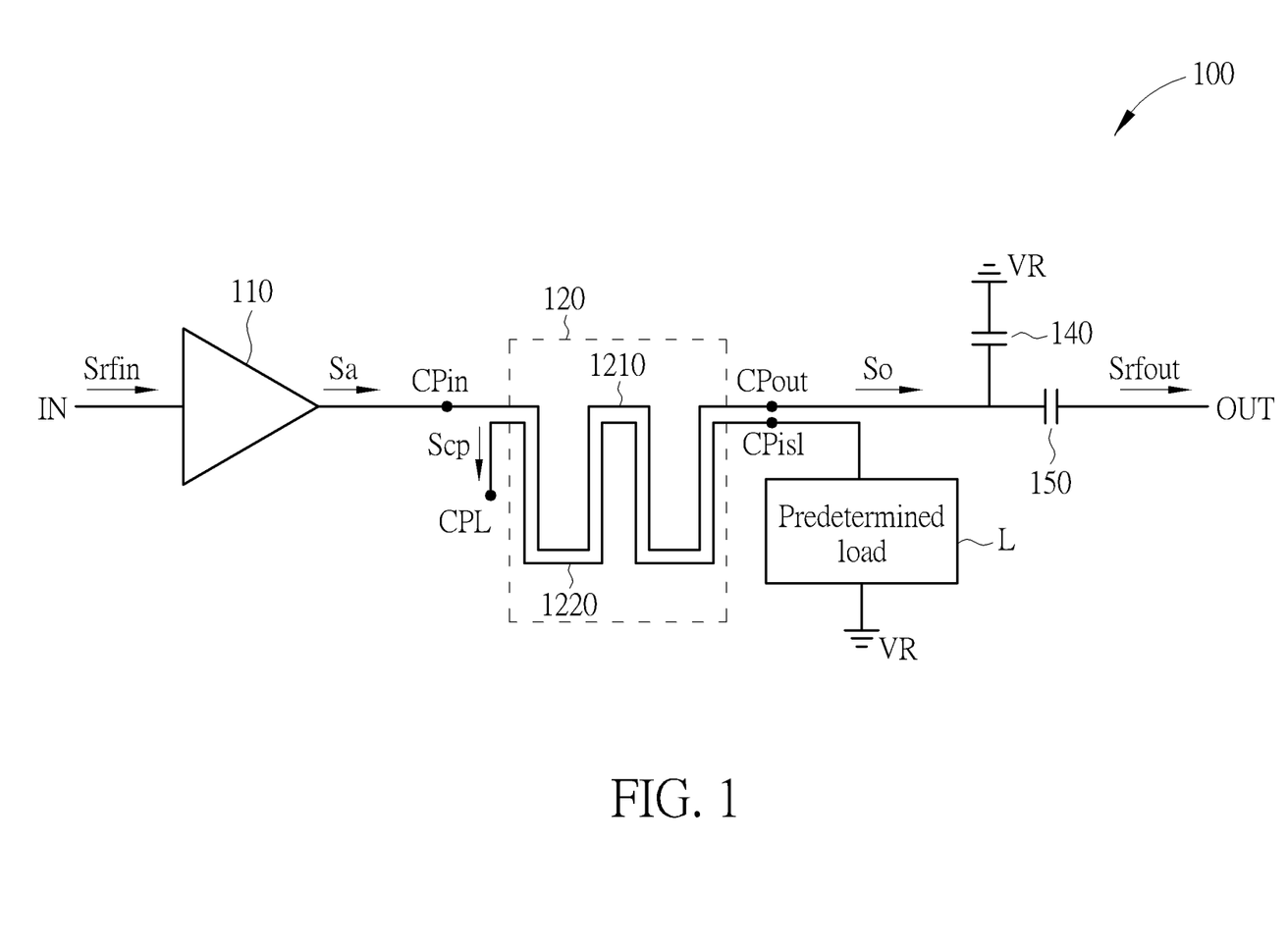

FIG. 1 illustrates an amplification device 100 according to an embodiment. The amplification device 100 can include a signal input terminal IN, a signal output terminal OUT, an amplification unit 110, a coupler 120 and a first capacitive element 140. The amplification unit 110 can include an input terminal and an output terminal, where the input terminal can be coupled to the signal input terminal IN. The coupler 120 can include an input terminal CPin, an output terminal CPout and a coupling terminal CPL, where the input terminal CPin can be coupled to the output terminal of the amplification unit 110, and the output terminal CPout can be coupled to the signal output terminal OUT. The first capacitive element 140 can include a first terminal and a second terminal, where the first terminal can be coupled to the output terminal of the coupler CPout, and the second terminal can be coupled to a reference voltage terminal VR.

The input terminal of the amplification unit 110 can receive a radio frequency input signal Srfin. The output terminal of the amplification unit 110 can output an amplified signal Sa. The output terminal CPout of the coupler 120 can output an output signal So related to the amplified signal Sa. The coupling terminal CPL of the coupler 120 can output coupling signal Scp related to the amplified signal Sa. The signal output terminal OUT can output a radio frequency output signal Srfout related to the output signal So and the amplified signal Sa.

The coupler 120 can further include an isolation terminal CPisl, a first coupling element 1210 and a second coupling element 1220. The isolation terminal CPisl can be coupled to a predetermined load L. The predetermined load L can have a resistance between 45 ohms and 55 ohms. For example, the resistance of the predetermined load L can be 50 ohms. The first coupling element 1210 can include a first terminal and a second terminal, wherein the first terminal can be electrically connected to the input terminal CPin of the coupler 120, and the second terminal can be electrically connected to the output terminal CPout of the coupler 120. The second coupling element 1220 can be disposed along the first coupling element 1210 to be inductively coupled to the first coupling element 1210. The second coupling element 1220 can include a first terminal and a second terminal, where the first terminal can be electrically connected to the coupling terminal CPL of the coupler 120, and the second terminal can be electrically connected to the isolation terminal CPisl of the coupler 120. As shown in FIG. 1, the first coupling element 1210 and the second coupling element 1220 can have proper bent shapes by being bent or through place-and-route. Hence, the first coupling element 1210 and the second coupling element 1220 can be used as a matching circuit through electromagnetic induction for adjusting impedance and phases of signals. As a result, the coupler 120 of the amplification device 100 can be equivalent to a coupler and matching circuit for reducing coupling loss and reducing the circuit area.

Figure 2A:
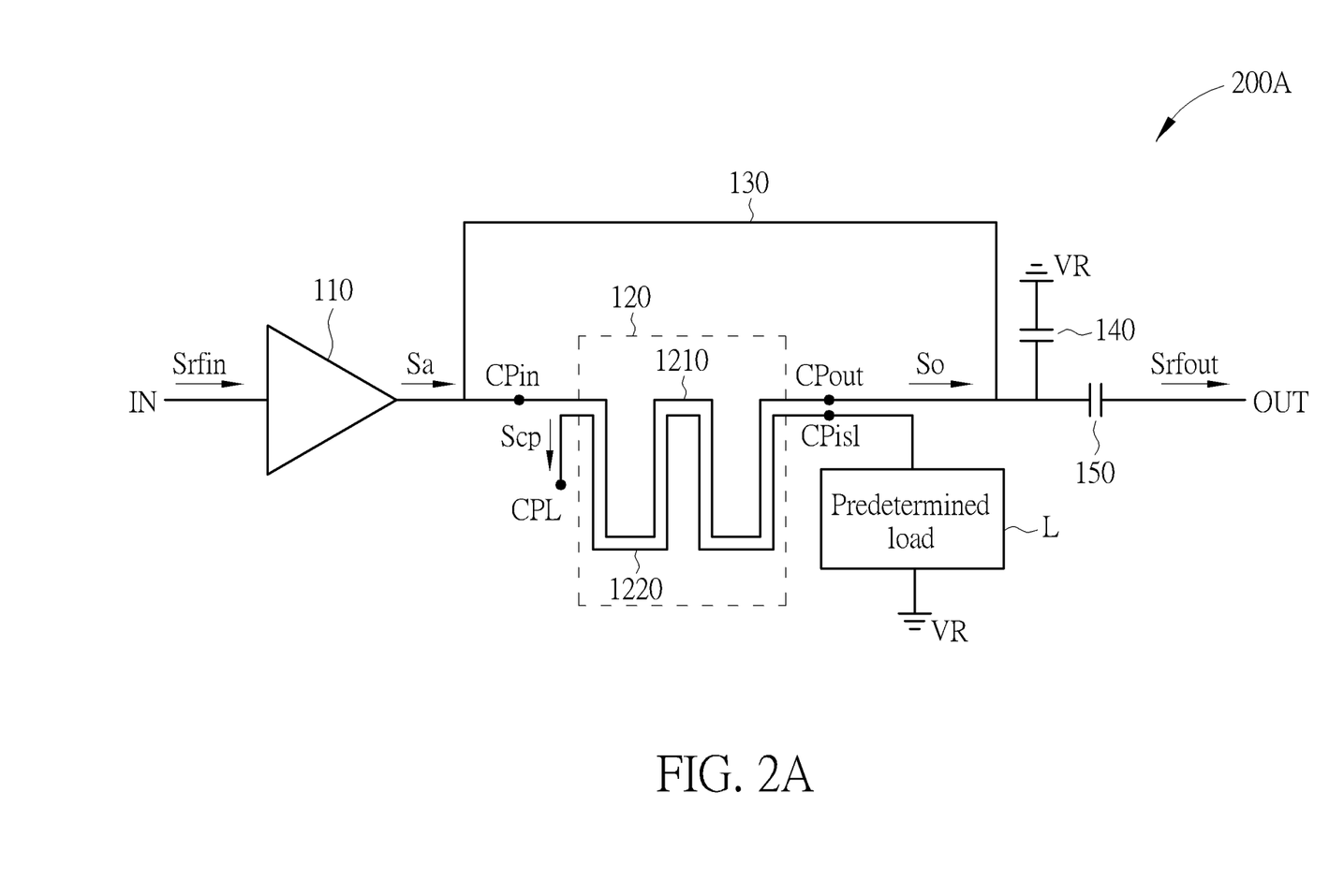

However, for providing a sufficient coupling factor, the inductance of the first coupling element 1210 may be excessive, causing the coupler 120 to fail to provide a predetermined matching value. Hence, the electrical characteristics of the amplification device 100 may be affected, for example, the output power may be insufficient. FIG. 2A illustrates an amplification device 200A according to another embodiment. The similarities of the amplification devices 100 and 200A are not repeatedly described. Compared with the amplification device 100, the amplification devices 200A can further include an inductive element 130. The inductive element 130 can be coupled to the coupler 120 in parallel and include a first terminal and a second terminal, where the first terminal can be coupled to the output terminal of the amplification unit 110, and the second terminal can be coupled to the output terminal CPout of the coupler 120. By disposing the inductive element 130 coupled to the coupler 120 in parallel, the inductance provided by the first coupling element 1210 can be equivalently reduced, so the coupler 120 can provide a proper matching value. For example, the matching value provided by the coupler 120 can be increased. In addition, the inductive element 130 can be inductively isolated from the first coupling element 1210 and the second coupling element 1220 to reduce the unwanted effect on the inductance provided by the first coupling element 1210. A distance between the first coupling element 1210 and the second coupling element 1220 can be smaller than a first maximum distance. A distance between the second coupling element 1220 and the inductive element 130 can be greater than a first minimum distance. The first minimum distance can be greater than twice the first maximum distance to prevent the inductive element 130 from being inductively coupled to the first coupling element 1210 and the second coupling element 1220.

The amplification device 200A can further include a direct current (DC) block capacitor 150. The direct current block capacitor 150 can include a first terminal and a second terminal and be coupled between the output terminal CPout of the coupler 120 and the signal output terminal OUT. The first terminal of the DC block capacitor 150 can be coupled to the output terminal CPout of the coupler 120 and the second terminal of the inductive element 130. The second terminal of the DC block capacitor 150 can be coupled to the signal output terminal OUT.

Figure 2B:
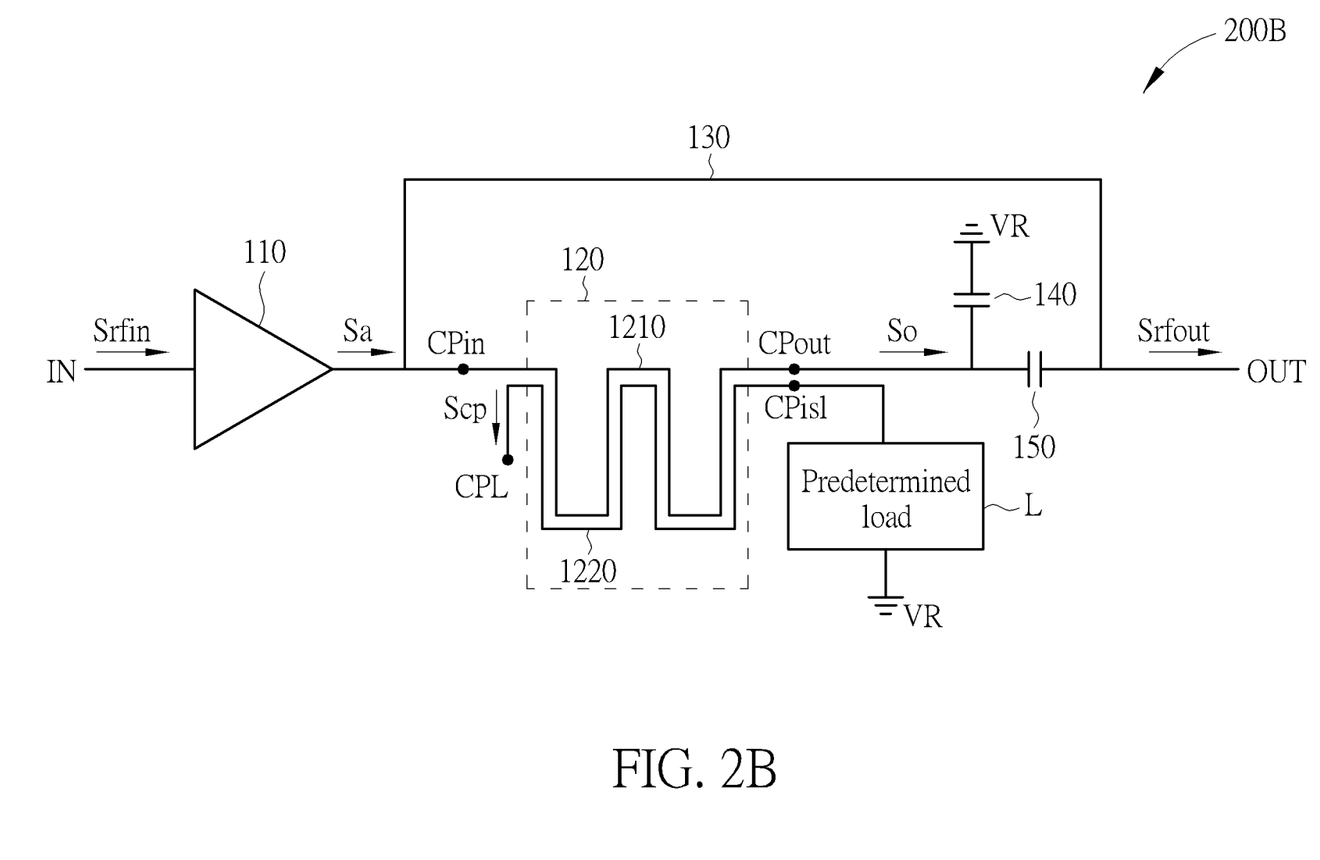

FIG. 2B illustrates an amplification device 200B according to another embodiment. The similarities of the amplification devices 200A and 200B are not repeatedly described. However, in the amplification device 200B, the first terminal of the DC block capacitor 150 can be coupled to the output terminal CPout of the coupler 120, and the second terminal of the DC block capacitor 150 can be coupled to the second terminal of the inductive element 130 and the signal output terminal OUT.

In the text, the inductive element 130 can include a first conductive wire and/or an inductor. In another embodiment, the inductive element 130 can include an inductor and a capacitor coupled to the inductor in series.

In FIG. 2A and FIG. 2B, the amplification unit 110 can be disposed on a first die, and the coupler 120 can be disposed on a second die. In other words, the amplification unit 110 and the coupler 120 can be disposed on different dies. Wire bonding can be used for electrically connecting the amplification unit 110 and the coupler 120.

In FIG. 2A and FIG. 2B, the input terminal CPin of the coupler 120 can be coupled to the output terminal of the amplification unit 110 via a second conductive wire. The output terminal CPout of the coupler 120 can be coupled to the signal output terminal OUT via a third conductive wire. The signal output terminal OUT can be disposed on a third die to be coupled to a radio frequency circuit. Among the first die, the second die and the third die, wire bonding can be used to implement electrical connections.

Figure 3A:
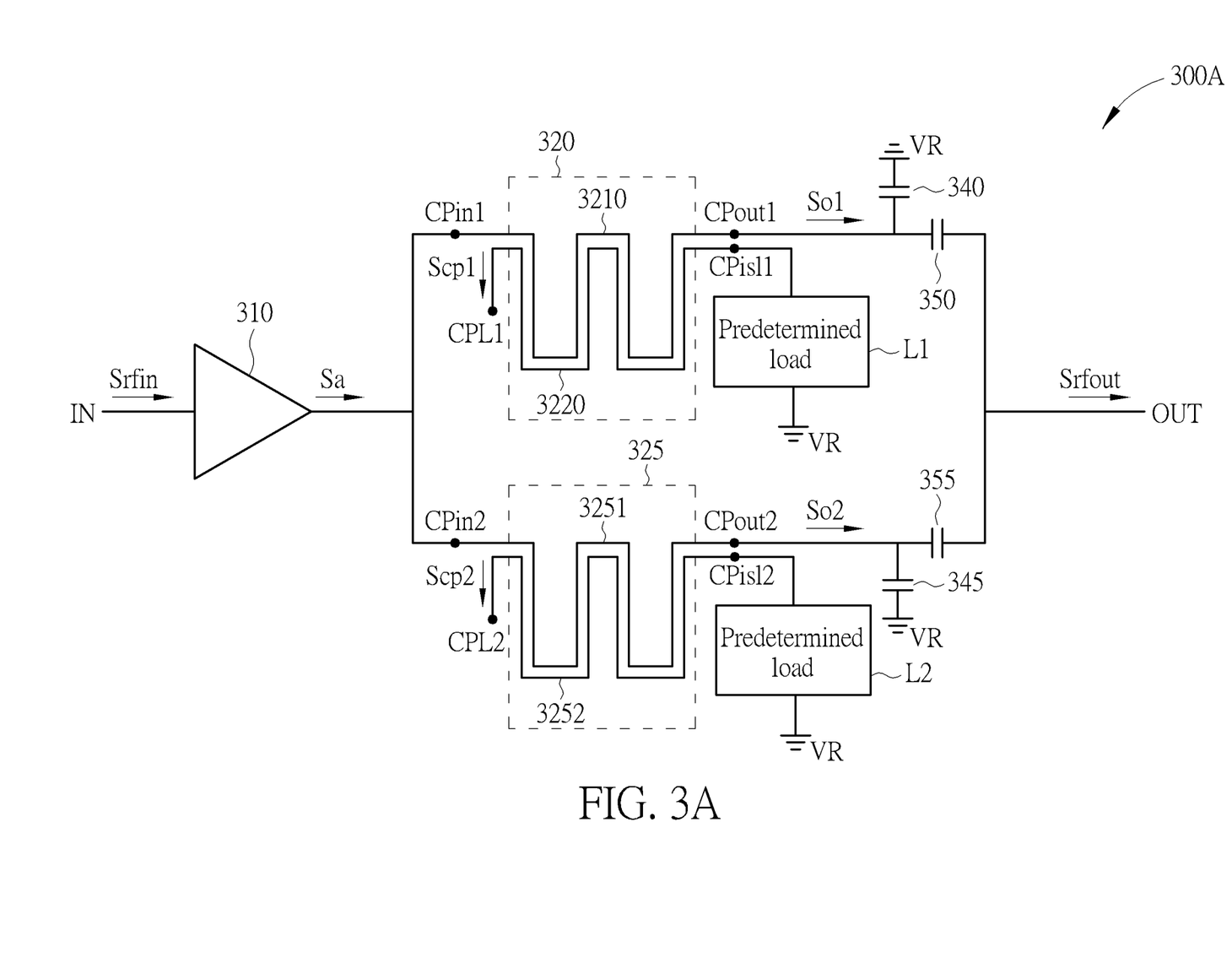

Moreover, in applications where the radio frequency input signal Srfin has a higher frequency (e.g. higher than 5 gigahertz), the length of the first coupling element 1210 is usually designed to be shorter. Hence, the coupling factor provided by the coupler 120 may be insufficient. In order to deal with this problem, an amplification device 300A can be used. FIG. 3A illustrates the amplification device 300A according to another embodiment. The amplification device 300A can include a signal input terminal IN, a signal output terminal OUT, an amplification unit 310, a first coupler 320, a first capacitive element 340, a second coupler 325 and a second capacitive element 345. The amplification unit 310 can include an input terminal and an output terminal, where the input terminal can be coupled to the signal input terminal IN. The first coupler 320 can include an input terminal CPin1, an output terminal CPout1, and a coupling terminal CPL1, where the input terminal CPin1 can be coupled to the output terminal of the amplification unit 310, and the output terminal CPout1 can be coupled to the signal output terminal OUT. The coupling terminal CPL1 can output a coupling signal Scp1. The first capacitive element 340 can include a first terminal and a second terminal, where the first terminal can be coupled to the output terminal CPout1 of the first coupler 320, and the second terminal can be coupled to a reference voltage terminal VR. The second coupler 325 can includes an input terminal CPin2, an output terminal CPout2 and a coupling terminal CPL2, where the input terminal CPin2 can be coupled to the output terminal of the amplification unit 310, and the output terminal CPout2 can be coupled to the signal output terminal OUT. The coupling terminal CPL2 can output a coupling signal Scp2. The second capacitive element 345 can include a first terminal and a second terminal, where the first terminal can be coupled to the output terminal CPout2 of the second coupler 325, and the second terminal can be coupled to the reference voltage terminal VR. Through the first coupler 320 and the second coupler 325 coupled in parallel, the matching value in the amplification device 300A is equivalently increased since the first coupler 320 and the second coupler 325 jointly provide a sufficient matching value.

The amplification device 300A can further include a first DC block capacitor 350 and a second DC block capacitor 355. The first DC block capacitor 350 can include a first terminal and a second terminal and be coupled between the output terminal CPout1 of the first coupler 320 and the signal output terminal OUT. The second DC block capacitor 355 can include a first terminal and a second terminal and be coupled between the output terminal CPout2 of the second coupler 325 and the signal output terminal OUT.

The first coupler 320 can further include an isolation terminal CPisl1, a first coupling element 3210 and a second coupling element 3220. The isolation terminal CPisl1 can be coupled to a first predetermined load L1. The first coupling element 3210 can include a first terminal and a second terminal, where the first terminal can be electrically connected to the input terminal CPin1 of the first coupler 320, and the second terminal can be electrically connected to the output terminal CPout1 of the first coupler 320. The second coupling element 3220 can be disposed along the first coupling element 3210 to be inductively coupled to the first coupling element 3210. The second coupling element 3220 can include a first terminal and a second terminal, where the first terminal can be electrically connected to the coupling terminal CPL1 of the first coupler 320, and the second terminal can be electrically connected to the isolation terminal CPisl1 of the first coupler 320.

The second coupler 325 can further include an isolation terminal CPisl2, a third coupling element 3251 and a fourth coupling element 3252. The isolation terminal CPisl2 can be coupled to a second predetermined load L2. The third coupling element 3251 can include a first terminal and a second terminal, where the first terminal can be electrically connected to the input terminal CPin2 of the second coupler 325, and the second terminal can be electrically connected to the output terminal CPout2 of the second coupler 325. The fourth coupling element 3252 can be disposed along the third coupling element 3251 to be inductively coupled to the third coupling element 3251. The fourth coupling element 3252 can include a first terminal and a second terminal, where the first terminal can be electrically connected to the coupling terminal CPL2 of the second coupler 325, and the second terminal can be electrically connected to the isolation terminal CPisl2 of the second coupler 325.

The first coupling element 3210 and the second coupling element 3220 can have proper bent shapes by being bent or through place-and-route so as to be used as a matching circuit through electromagnetic induction for adjusting impedance and phases of signals. The third coupling element 3251 and the fourth coupling element 3252 can have proper bent shapes by being bent or through place-and-route so as to be used as a matching circuit through electromagnetic induction for adjusting impedance and phases of signals.

In FIG. 3A, each of the first load L1 and the second load L2 can have a resistance between 90 ohms and 110 ohms. For example, the resistance of each of the first load L1 and the second load L2 can be 100 ohms.

The inductances generated by the first coupling element 3210, the second coupling element 3220, the third coupling element 3251 and the fourth coupling element 3252 can all be lower than 1 nanohenry (nH).

The input terminal (e.g. signal input terminal IN) of the amplification unit 110 can receive a radio frequency input signal Srfin. The output terminal of the amplification unit 110 can output an amplified signal Sa. The output terminal CPout1 of the first coupler 320 can output a first output signal So1 related to the amplified signal Sa. The output terminal CPout2 of the second coupler 325 can output a second output signal So2 related to the amplified signal Sa. Each of the coupling signals Scp1 and Scp2 can be related to the amplified signal Sa. The signal output terminal OUT can output a radio frequency output signal Srfout related to the first output signal So1, the second output signal So2 and the amplified signal Sa. According to one embodiment, the amplified signal Sa is related to a combination of the coupling signals Scp1 and Scp2, and the radio frequency output signal Srfout is related to a combination of the first output signal So1 and the second output signal So2. The radio frequency input signal Srfin can have a frequency higher than 5 gigahertz. Hence, the amplification device 300A can support the applications with higher frequencies, such as Wi-Fi 6 communications.

The amplification unit 310 can be disposed on a first die, and the first coupler 320 and the second coupler 325 can be disposed on a second die. Between the amplification unit 310 and the first coupler 320, and between the amplification unit 310 and the second coupler 325, wire bonding can be used for electrical connections.

The capacitance of each of the first capacitive element 340 and the second capacitive element 345 in FIG. 3A can be half of the capacitance of the first capacitive element 140.

Figure 3B:
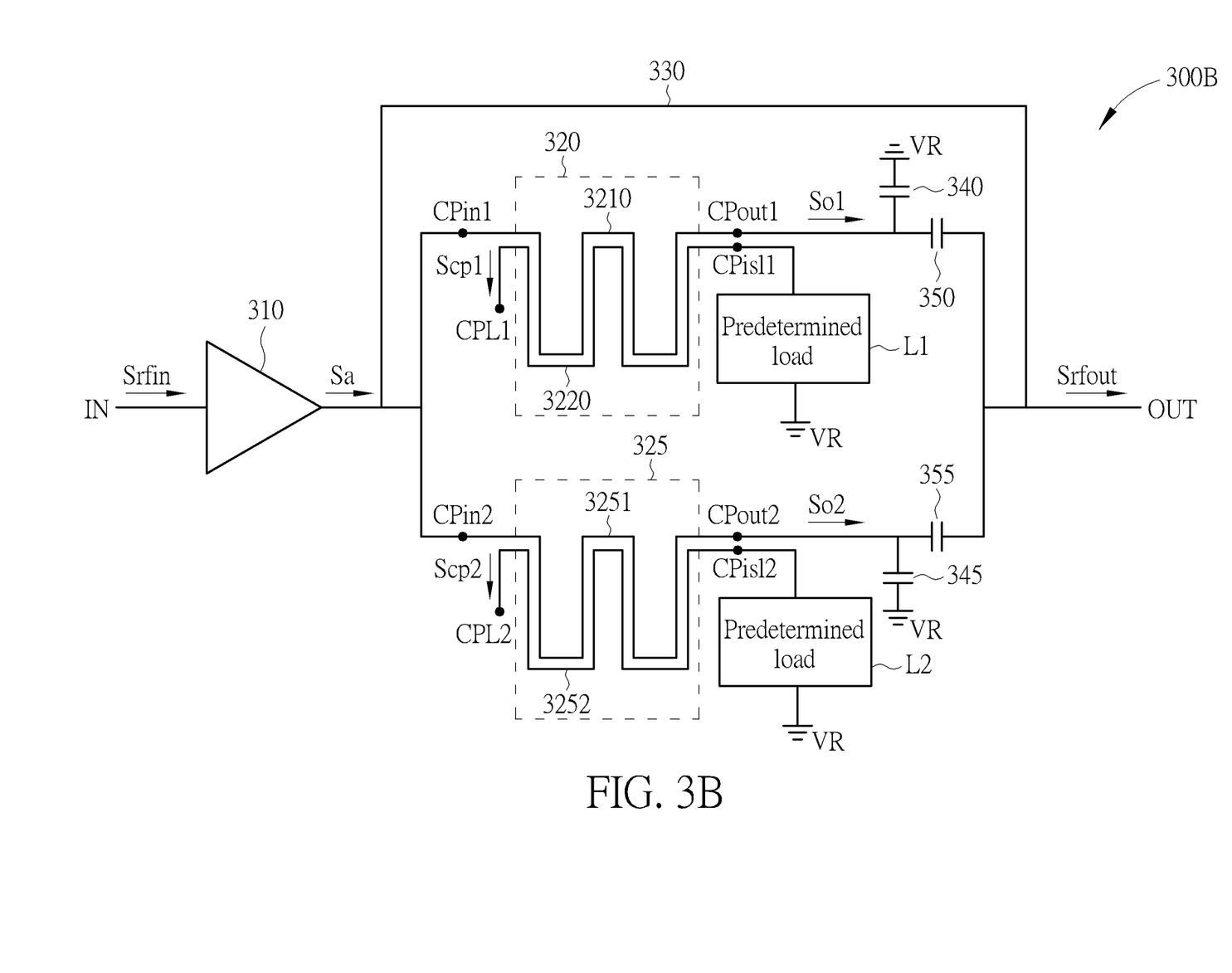

FIG. 3B illustrates an amplification device 300B according to another embodiment. The similarities between the amplification devices 300A and 300B are not repeatedly described. The amplification device 300B can further include an inductive element 330. The inductive element 330 can be coupled to the first coupler 320 and the second coupler 325 in parallel. The inductive element 330 can include a first terminal and a second terminal, where the first terminal can be coupled to the output terminal of the amplification unit 310, and the second terminal can be coupled to the output terminal CPout1 of the first coupler 320 and the output terminal CPout2 of the second coupler 325. By having the inductive element 330, the first coupler 320 and the second coupler 325 coupled in parallel, the matching value provided by the first coupler 320 and the second coupler 325 is improved. The inductive element 330 can include a first conductive wire and/or an inductor. The inductive element 330 can be inductively isolated from the first coupling element 3210, the second coupling element 3220, the third coupling element 3251 and the fourth coupling element 3252 to reduce the unwanted effect on the inductance provided by the first coupling element 3210 and the third coupling element 3251.

Figure 4:
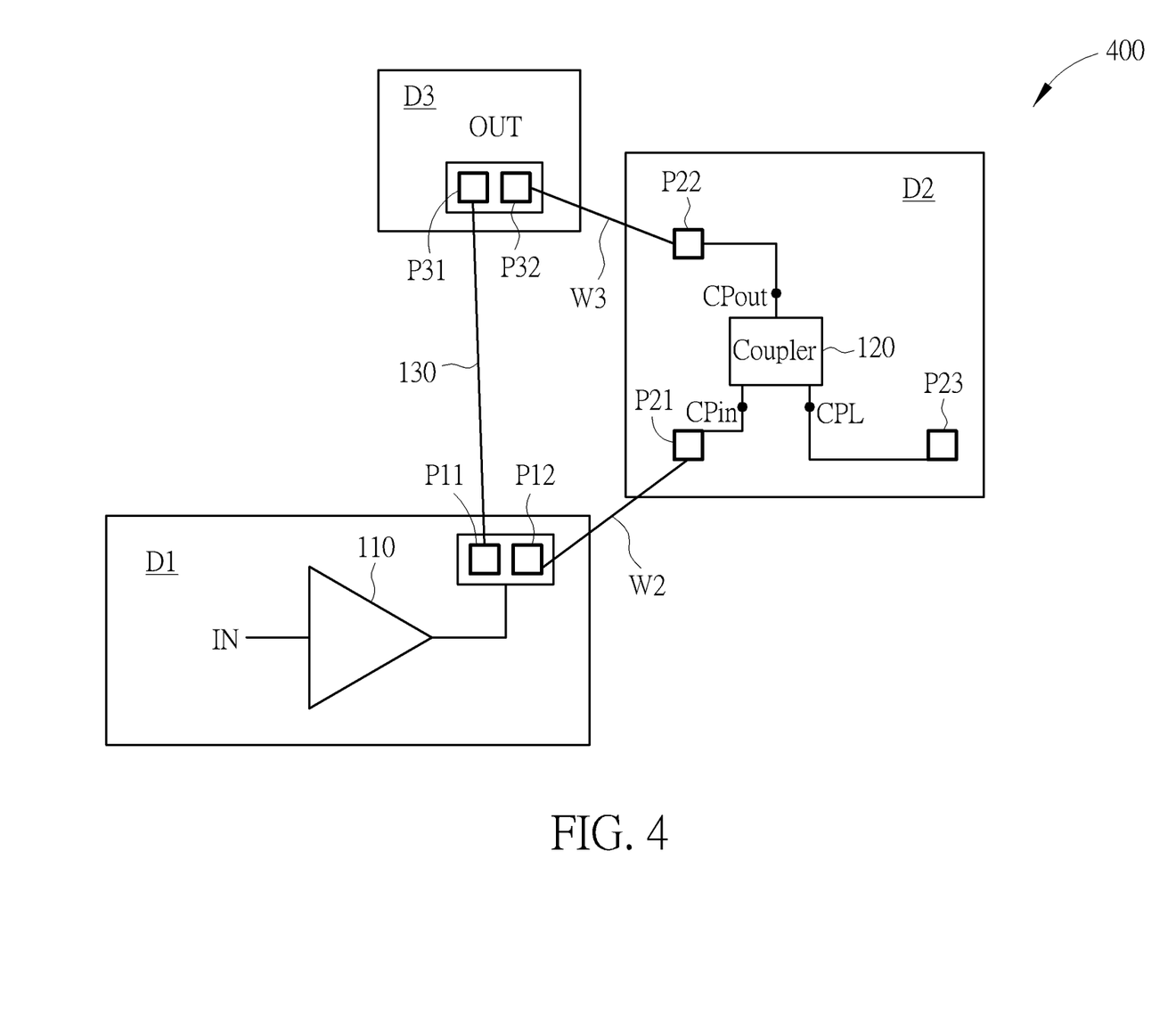
FIG. 4 to FIG. 8 illustrate wire bonding diagrams of amplification devices according to different embodiments.

FIG. 4 illustrates a wire bonding diagram of an amplification device 400 according to an embodiment. The amplification device 400 can be corresponding to the amplification devices 200A and 200B. The amplification device 400 can include the amplification unit 110 and the coupler 120. However, the coupler 120 in FIG. 4 is not coupled to a predetermined load and a capacitive element yet. In the amplification device 400, the amplification unit 110 can be disposed on the die D1. The coupler 120 can be disposed on the die D2. The signal output terminal OUT can be disposed on the die D3 to be coupled to a circuit (e.g. radio frequency circuit and switch circuit) on the die D3.

The output terminal of the amplification unit 110 can be electrically connected to the pads P11 and P12 of the die D1. The input terminal CPin can be electrically connected to the pad P21 of the die D2. The output terminal CPout can be electrically connected to the pad P22 of the die D2. The coupling terminal CPL can be electrically connected to the pad P23 of the die D2. The signal output terminal OUT of the amplification device 400 can be electrically connected to the pads P31 and P32 of the die D3.

The inductive element 130 can be coupled to the pads P11 and P31. A conductive wire W2 can be coupled to the pads P12 and P21 to connect the output terminal of the amplification unit 110 and the input terminal CPin of the coupler 120. A conductive wire W3 can be coupled to the pads P22 and P32 to connect the output terminal CPout of the coupler 120 and the signal output terminal OUT. The inductive element 130 and the wires W2 and W3 can be implemented through wire bonding to connect different dies.

Figure 5:
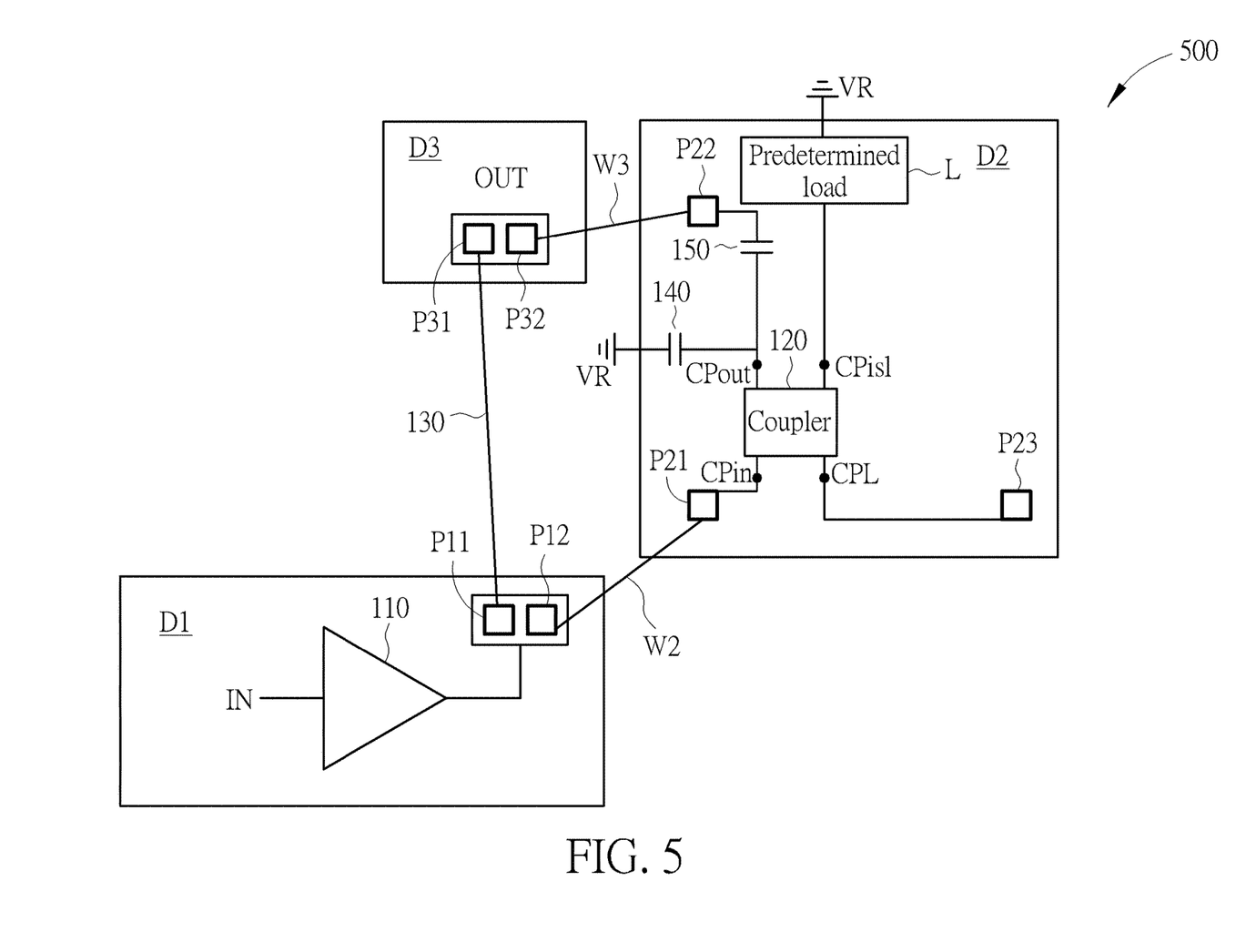

FIG. 5 illustrates a wire bonding diagram of an amplification device 500 according to another embodiment. The amplification device 500 can be corresponding to the amplification device 200B. The similarities between the amplification devices 500 and 400 are not repeatedly described. The amplification device 500 can further include the predetermined load L, the first capacitive element 140 and the DC block capacitor 150. The predetermined load L can be coupled between the isolation terminal CPisl of the coupler 120 and the reference voltage terminal VR. The first capacitive element 140 can be coupled between the output terminal CPout of the coupler 120 and the reference voltage terminal VR. The DC block capacitor 150 can be coupled between the output terminal CPout of the coupler 120 and the signal output terminal OUT.

By disposing elements of the amplification devices 400 and 500 on different dies, and disposing the inductive element 130 through wire bonding, the flexibility of design and process is improved. By adjusting wire length, wire loop shapes and materials of wire bonding, related electrical characteristics can be adjusted. According to embodiments, different dies in use can be electrically connected to one another and packaged through three dimensional (3D) stacking.

Figure 6:
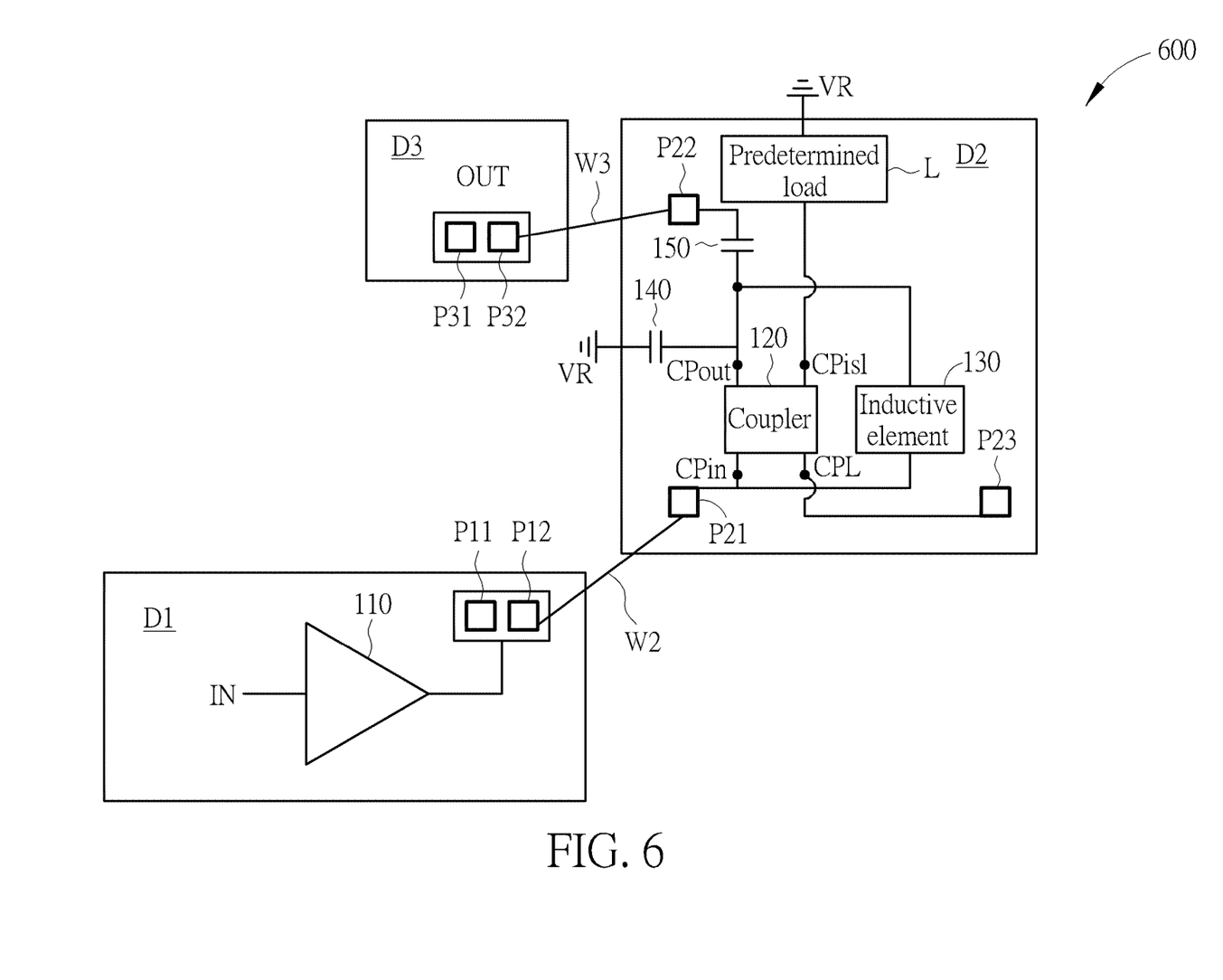

FIG. 6 illustrates a wire bonding diagram of an amplification device 600 according to another embodiment. The amplification device 600 can be corresponding to the amplification device 200A. The similarities among the amplification devices 600, 400 and 500 are not repeatedly described. Compared with the amplification devices 400 and 500, the inductive element 130 of the amplification device 600 can be disposed on the die D2 and be coupled between the input terminal CPin and the output terminal CPout of the coupler 120.

Figure 7:
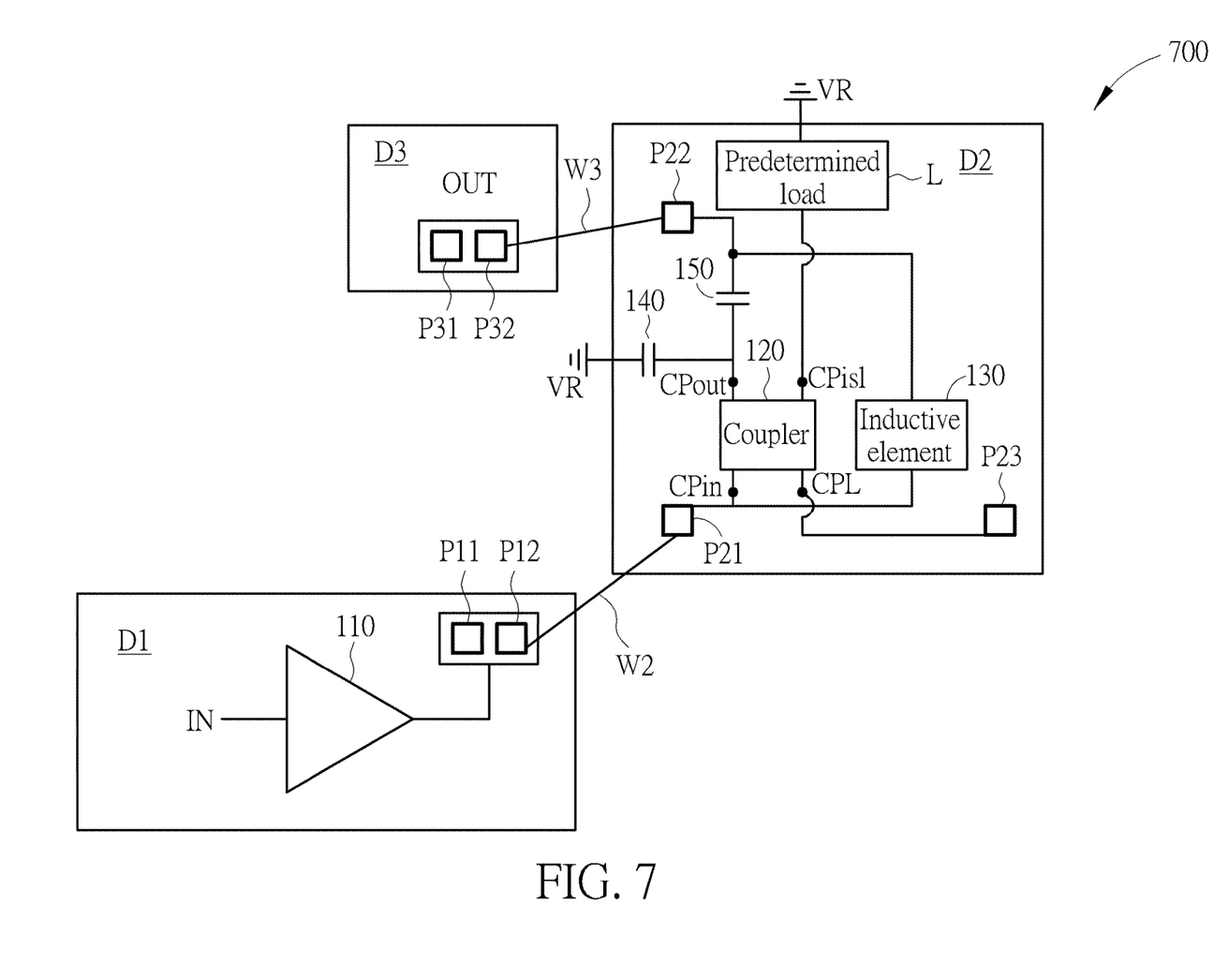

FIG. 7 illustrates a wire bonding diagram of an amplification device 700 according to another embodiment. The amplification device 700 can be corresponding to the amplification device 200B. The similarities among the amplification devices 700, 400 and 500 are not repeatedly described. Compared with the amplification device 500, the inductive element 130 of the amplification device 600 can be disposed on the die D2 and be coupled between the input terminal CPin and the output terminal CPout of the coupler 120.

Figure 8A:
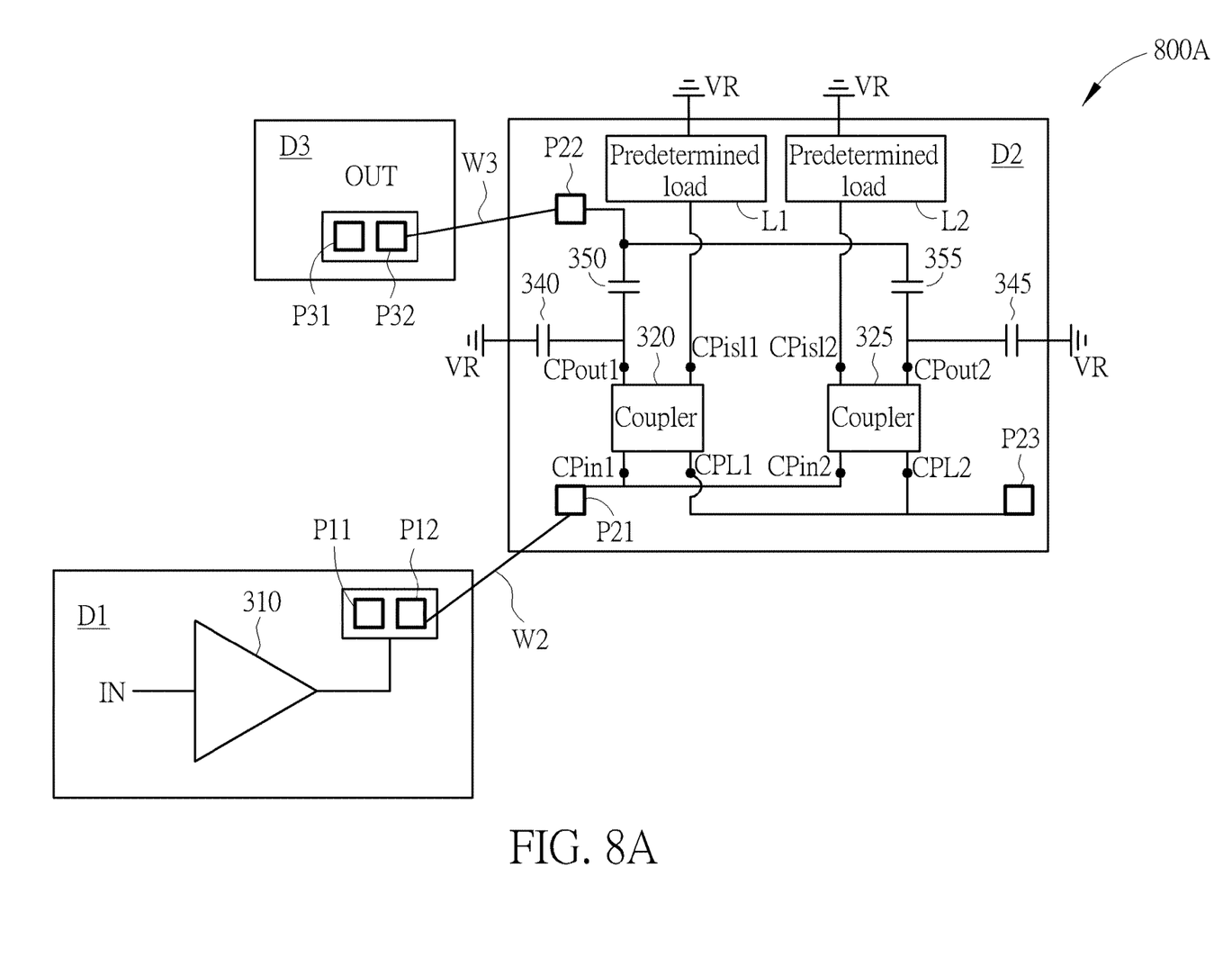

FIG. 8A illustrates a wire bonding diagram of an amplification device 800A according to another embodiment. The amplification device 800A can be corresponding to the amplification device 300A. The similarities among the amplification devices 800A, 600 and 700 are not repeatedly described. In FIG. 8A, the amplification unit 310 can be disposed on the die D1. The first coupler 320, the first capacitive element 340, the second coupler 325, the second capacitive element 345, the first DC block capacitor 350, the second DC block capacitor 355, the first predetermined load L1 and the second predetermined load L2 can be disposed on the die D2. The signal output terminal OUT can be disposed on the die D3 to be coupled to a circuit (e.g. radio frequency circuit and switch circuit) on the die D3.

Figure 8B:
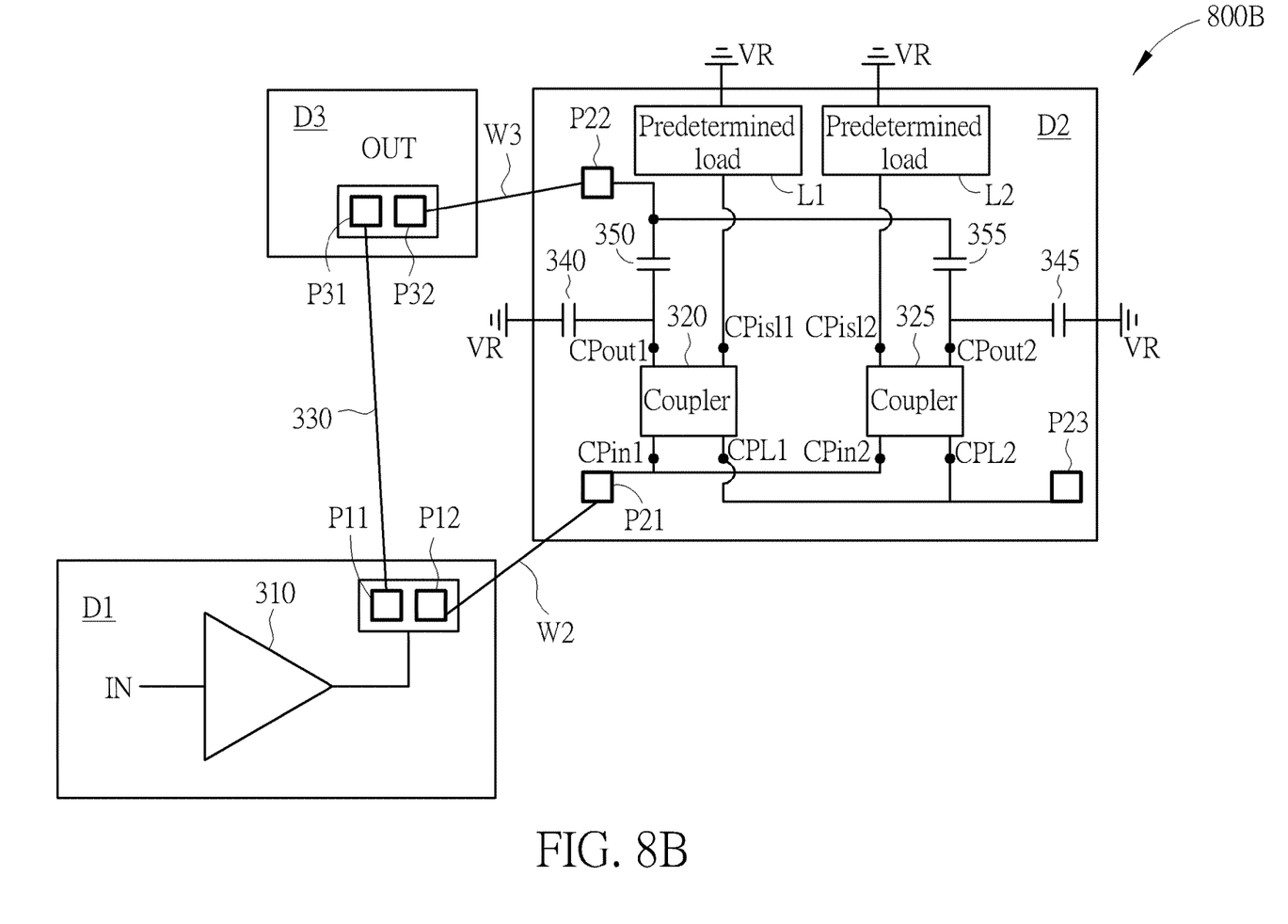

FIG. 8B illustrates a wire bonding diagram of an amplification device 800B according to another embodiment. The amplification device 800B can be corresponding to the amplification device 300B. The similarities between the amplification devices 800B and 800A are not repeatedly described. Compared with the amplification device 800A, the inductive element 330 of the amplification devices 800B can be disposed through wire bonding and be coupled between the pads P11 and P31.

By disposing elements of the amplification device 800B on different dies, and disposing the inductive element 330 through wire bonding, the flexibility of design and process is improved. By adjusting wire length, wire loop shapes and materials of wire bonding, related electrical characteristics can be adjusted. According to embodiments, different dies in use can be electrically connected to one another and packaged through three dimensional (3D) stacking.

In summary, through the amplification devices 200A to 800B, an improved solution is provided for reducing coupling loss and circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplification device, comprising:
   a signal input terminal;
   a signal output terminal;
   an amplification unit comprising an input terminal coupled to the signal input terminal, and an output terminal;
   a coupler comprising an input terminal coupled to the output terminal of the amplification unit, an output terminal coupled to the signal output terminal, and a coupling terminal;
   a first inductive element coupled to the coupler in parallel, and comprising a first terminal coupled to the output terminal of the amplification unit, and a second terminal coupled to the output terminal of the coupler; and
   a first capacitive element comprising a first terminal coupled to the output terminal of the coupler, and a second terminal coupled to a reference voltage terminal.

2. The amplification device of claim 1, wherein the coupler further comprises:
   an isolation terminal configured to couple to a predetermined load;
   a first coupling element comprising a first terminal electrically connected to the input terminal of the coupler, and a second terminal electrically connected to the output terminal of the coupler; and
   a second coupling element disposed along the first coupling element, and comprising a first terminal electrically connected to the coupling terminal of the coupler, and a second terminal electrically connected to the isolation terminal of the coupler.

3. The amplification device of claim 2, wherein the first inductive element is inductively isolated from the first coupling element and the second coupling element.

4. The amplification device of claim 2, wherein a distance between the first coupling element and the second coupling element is smaller than a first maximum distance, a distance between the second coupling element and the first inductive element is greater than a first minimum distance, and the first minimum distance is greater than twice the first maximum distance.

5. The amplification device of claim 1, further comprising:
   a direct current block capacitor comprising a first terminal and a second terminal, and coupled between the output terminal of the coupler and the signal output terminal.

6. The amplification device of claim 5, wherein:
   the first terminal of the direct current block capacitor is electrically connected to the output terminal of the coupler and the second terminal of the first inductive element, and the second terminal of the direct current block capacitor is electrically connected to the signal output terminal.

7. The amplification device of claim 5, wherein:
   the first terminal of the direct current block capacitor is electrically connected to the output terminal of the coupler, and the second terminal of the direct current block capacitor is electrically connected to the second terminal of the first inductive element and the signal output terminal.

8. The amplification device of claim 1, wherein the first inductive element comprises one of a first conductive wire and an inductor.

9. The amplification device of claim 1, wherein the amplification unit is disposed on a first die, and the coupler is disposed on a second die.

10. The amplification device of claim 9, wherein the input terminal of the coupler is coupled to the output terminal of the amplification unit via a second conductive wire, and the output terminal of the coupler is coupled to the signal output terminal via a third conductive wire.

11. The amplification device of claim 10, wherein the signal output terminal is disposed on a third die to be coupled to a radio frequency circuit.

* * * * *